(12) United States Patent
Breitschwerdt et al.

(10) Patent No.: US 7,149,070 B2
(45) Date of Patent: Dec. 12, 2006

(54) HOLDING DEVICE, IN PARTICULAR FOR FIXING A SEMICONDUCTOR WAFER IN A PLASMA ETCHING DEVICE, AND METHOD FOR SUPPLYING HEAT TO OR DISSIPATING HEAT FROM A SUBSTRATE

(75) Inventors: Klaus Breitschwerdt, Filder Stadt (DE); Franz Laermer, Weil der Stadt (DE); Andrea Urban, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/495,648

(22) PCT Filed: Oct. 4, 2002

(86) PCT No.: PCT/DE02/03767

§ 371 (c)(1),
(2), (4) Date: Oct. 26, 2004

(87) PCT Pub. No.: WO03/046953

PCT Pub. Date: Jun. 5, 2003

(65) Prior Publication Data

US 2005/0083634 A1    Apr. 21, 2005

(30) Foreign Application Priority Data

Nov. 16, 2001   (DE) ................................ 101 56 407

(51) Int. Cl.
*H02H 23/00*   (2006.01)
(52) U.S. Cl. ...................................... 361/234; 361/233
(58) Field of Classification Search ........ 361/230–234; 156/345.47
See application file for complete search history.

(56) References Cited

U.S. PATENT DOCUMENTS

| | | | |
|---|---|---|---|
| 5,073,716 A | | 12/1991 | Clemens et al. |
| 5,203,401 A | * | 4/1993 | Hamburgen et al. ....... 165/80.4 |
| 5,671,116 A | | 9/1997 | Husain |
| 5,671,117 A | * | 9/1997 | Sherstinsky et al. ........ 361/234 |
| 5,748,436 A | * | 5/1998 | Honma et al. .............. 361/234 |
| 5,835,334 A | * | 11/1998 | McMillin et al. ........... 361/234 |
| 5,885,423 A | | 3/1999 | Guyot |
| 5,904,776 A | | 5/1999 | Lue et al. |
| 5,986,875 A | | 11/1999 | Clinton et al. |

(Continued)

FOREIGN PATENT DOCUMENTS

DE    42 41 045    5/1994

(Continued)

*Primary Examiner*—Brian Sircus
*Assistant Examiner*—Danny Nguyen
(74) *Attorney, Agent, or Firm*—Kenyon & Kenyon LLP

(57) ABSTRACT

A holding device including a holding element, on which a substrate is electrostatically fixed, positioned on a substrate electrode. In one configuration, a load body on the substrate electrode presses the holding element onto it, and is connected via a clamping device, which presses the former onto the substrate electrode, with a base, which supports the substrate electrode, the load body and the base being electrically insulated from the substrate electrode. In another configuration, the side of the holding element faces the substrate as an electrically insulating ferroelectric or piezoelectric material. Another configuration includes a device via which a liquid convection medium is feedable into a space formed by the holding element and substrate or is removable from there again. A method for supplying heat or dissipating heat from the back of a substrate to which heat is applied from the front, and which is held by the holding device.

21 Claims, 4 Drawing Sheets

U.S. PATENT DOCUMENTS

| | | | |
|---|---|---|---|
| 6,063,198 A * | 5/2000 | Bang et al. ................. 118/715 |
| 6,129,808 A * | 10/2000 | Wicker et al. ........... 156/345.1 |
| 6,162,336 A * | 12/2000 | Lee ....................... 204/298.15 |
| 6,267,839 B1 | 7/2001 | Kholodenko et al. |
| 6,320,736 B1 * | 11/2001 | Shamouilian et al. ....... 361/234 |
| 2001/0005595 A1 | 6/2001 | Fujiwara et al. |

FOREIGN PATENT DOCUMENTS

| | | |
|---|---|---|
| DE | 44 03 552 | 8/1994 |
| EP | 0 511 928 | 11/1992 |
| EP | 0 669 6 44 | 8/1995 |
| EP | 0 755 066 | 1/1997 |
| EP | 0777262 | 6/1997 |
| EP | 0 840 434 | 5/1998 |
| EP | 1 114 805 | 7/2001 |
| JP | 06 349938 | 12/1994 |
| JP | 07 273 174 | 10/1995 |
| JP | 07 235588 | 1/1996 |
| JP | 11-265879 | 9/1999 |
| JP | 11-330056 | 11/1999 |
| JP | 2000-31253 | 1/2000 |
| WO | WO 00 70657 | 11/2000 |

* cited by examiner

HOLDING DEVICE, IN PARTICULAR FOR FIXING A SEMICONDUCTOR WAFER IN A PLASMA ETCHING DEVICE, AND METHOD FOR SUPPLYING HEAT TO OR DISSIPATING HEAT FROM A SUBSTRATE

FIELD OF THE INVENTION

The present invention relates to holding devices, in particular for fixing a semiconductor wafer in a plasma etching device, and a method for supplying heat to or dissipating heat from the back of a substrate that is held by one of these holding devices in a vacuum chamber.

BACKGROUND INFORMATION

In anisotropic high-rate etching of silicon substrates, for example in the manner referred to in German patent publication no. 42 41 045, it is necessary to cool the substrate from its back, since significant quantities of heat are brought into the substrate from the plasma through the effect of rays, electrons and ions, as well as through heat of reaction developing on the wafer surface. If this heat is not dissipated in a controlled manner, the substrate overheats and the etching result worsens significantly.

U.S. Pat. Nos. 6,267,839 and 5,671,116, European patent document no. 840 434, and Japanese patent document no. 11330056, refer to so-called electrostatic "chucks," i.e., holding devices via which a semiconductor wafer, in particular a silicon wafer, is electrostatically fixable on a substrate electrode, for example in a plasma etching device. Another holding device in the form of an electrostatic "chuck" is shown in FIG. 1. This configuration may be found today in plasma etching systems.

In detail, it is provided that the substrate electrode, to which for example a high-frequency voltage is applied, is clamped onto a grounded base plate by ceramic insulators and a suitable clamping device, O-rings ensuring the vacuum seal, so that the substrate to be etched is able to be subjected to a vacuum. It is also provided for the substrate electrode to have a cooling agent, for example deionized water, methanol or other alcohols, fluorocarbons or silicones, flowing through it internally. Located on the substrate electrode itself is the "chuck" for electrostatically clamping the wafer or substrate lying on it, which is supplied with high voltage via conventional high-voltage feed-throughs, in order to exert the desired clamping force on the wafer positioned on top of it.

Finally, FIG. 1 provides that the surface of the "chuck," not covered by the substrate, and the surrounding substrate electrode surface are covered by a ceramic plate placed on the substrate electrode, in order to prevent the plasma existing or produced above it from acting on the metal surfaces of the substrate electrode, which could result in detrimental sputtering-off of metal and an unwanted current flow into the plasma.

The heat flow from the underside of the overlaid wafer to the electrostatic "chuck" or the substrate electrode is guaranteed finally by a helium cushion, i.e., there are suitably shaped spaces between the underside of the wafer and the "chuck" and between the "chuck" and the substrate electrode surface, which are filled with helium at a pressure ranging from a few mbar to a maximum of about 20 mbar.

Alternatively to electrostatic clamping or fixing of a wafer, mechanical clamping devices are also known in the related art, which press the wafer onto the substrate electrode and allow helium to be applied to the back of the wafer as a convection medium. The mechanical clamping has substantial disadvantages, however, and is being replaced increasingly by electrostatic "chucks," which particularly ensure favorable flat wafer clamping.

SUMMARY OF THE INVENTION

The holding devices according to the exemplary embodiment of the present invention and the exemplary method according to the present invention for supplying heat to or dissipating heat from the back of a substrate held in a vacuum chamber have the advantage over the related art, that significantly improved thermal coupling of the wafer to the underlying "chuck" or substrate electrode is achieved, and that the supplying of heat to or dissipation of heat from the back of the substrate takes place substantially more reliably, uniformly, and effectively.

In particular, in connection with conventional plasma high-rate etching methods, the surroundings of the wafer, and above all the temperature of the ceramic plate, which is positioned as shown in FIG. 1 and is not directly connected with the etched wafer, play a significant role in regard to the process results.

For example, the ceramic plate used heretofore, which is merely laid on top, may result in significant nonhomogeneities of the etching from the middle of the wafer toward the edge, and in particular to a significant increase in the etching rate in the edge area of the wafer, which is attributed to inadequate and/or uneven heat dissipation from the ceramic plate, which when heated develops detrimental effects in its vicinity on the substrate electrode, i.e., also in the area of the edge of the wafer. These disadvantages may be surmounted by the holding devices according to the exemplary embodiment and/or exemplary method of the present invention.

Also, with the device of FIG. 1, helium as a convection medium is only able to perform relatively limited heat dissipation, which is only increasable by higher gas pressure. However, the electrostatic holding forces of conventional electrostatic "chucks" set an upper limit here of 10 mbar to 20 mbar. An alternative mechanical wafer clamping in the area of the wafer edge also does not offer a satisfactory solution, since pressures of more than 20 mbar may result in the wafers breaking under the force thus exerted on them. These disadvantages are overcome above all by the electrically insulating ferroelectric material or piezoelectric material used in a configuration according to the exemplary embodiment and/or exemplary method of the present invention, with which a significantly higher electrostatic clamping force may be exerted on the wafer, and which thus allows an increase in the pressure of the convection medium, in particular helium, to more than 20 mbar.

The electrostatic holding forces achievable heretofore with conventional electrostatic "chucks" may also be inadequate because they are limited by the puncture strength of the dielectric materials used in the "chuck." In this respect the clamping voltages have been limited to date to the range between 1000 V and 2000 V. At higher voltages, the risk of puncture increases significantly, and the life of the dielectric materials employed also decreases. The risk of puncture is also accompanied by significant EMC risks (EMC=electromagnetic compatibility), which may damage the electronics of the plasma etching system. This problem may also be significantly eased by the holding device according to the exemplary embodiment and/or exemplary method of the present invention.

With the various holding devices according to the exemplary embodiment and/or exemplary method of the present invention, which target improved and more uniform heat dissipation from the back of the substrate and more even heat distribution in the vicinity of the etched substrate, and which are also used for increasing electrostatic clamping forces and simplifying fixing and releasing of the wafer from the holding device, are combinable with each other as desired.

DETAILED DESCRIPTION

Figure 1:
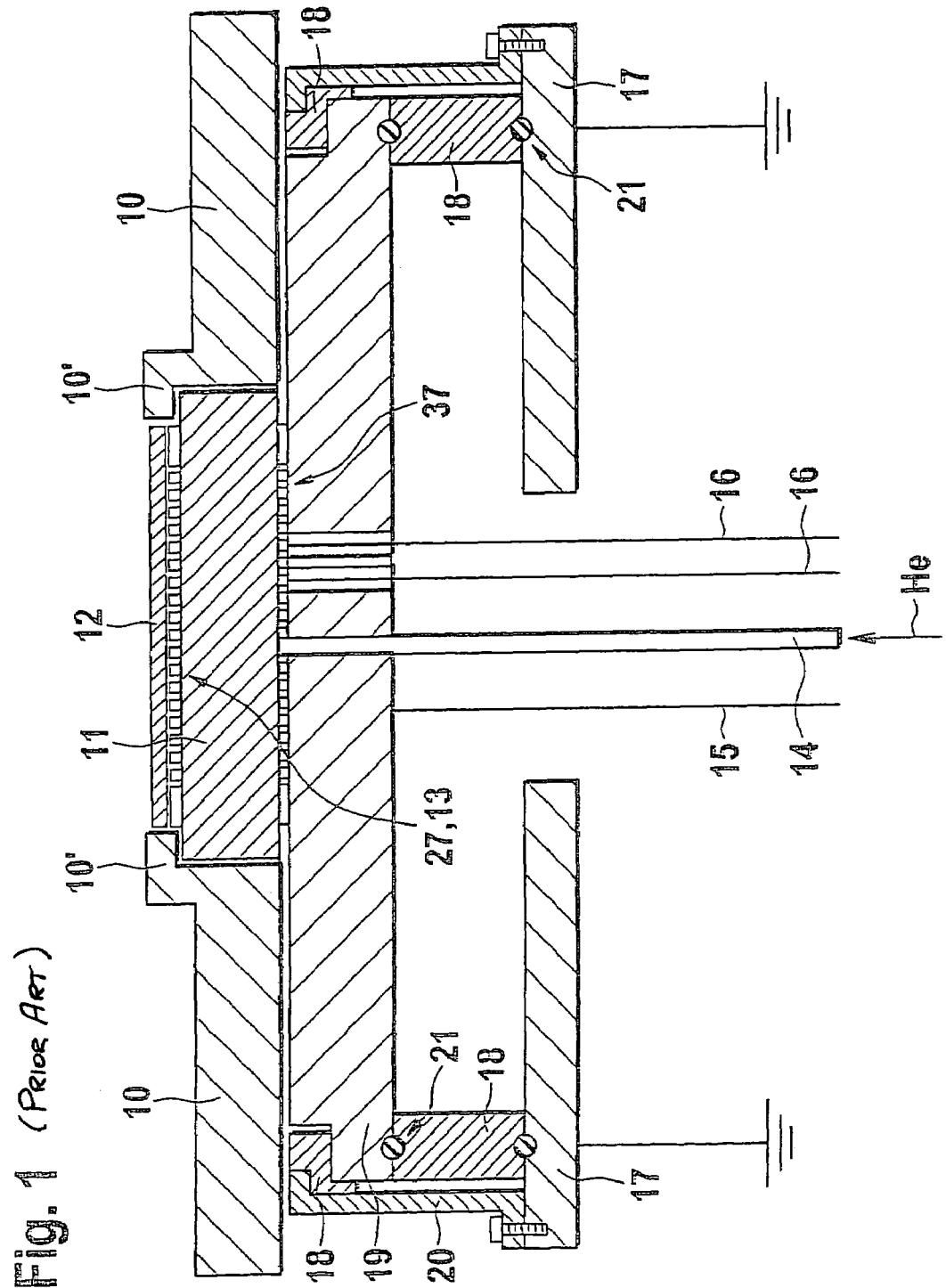
FIG. 1 shows an electrostatic holding device from the related art.

FIG. 1 initially illustrates an electrostatic "chuck" from the related art, i.e., an electrostatic holding device for a substrate 12, for example a conventional silicon wafer. Under substrate 12 is a holding element 11 that secures this, for example an electrostatic "chuck" designed in the form of a holding plate. Holding element 11 is also placed on a metallic substrate electrode 19, which is connected via insulators 18, which may be ceramic insulators 18, with a base or support 17, which is also made of a metal. To ensure the vacuum seal, seals 21, for example O-rings of rubber, are provided between insulators 18 and substrate electrode 19 or between insulators 18 and base 17.

FIG. 1 also shows that base 17 is connected to substrate electrode 19 via a metallic holder 20, ceramic insulators 18 may also be provided between holder 20 and substrate electrode 19, so that base 17 is completely electrically insulated from substrate electrode 19. Furthermore, a ceramic plate is placed on substrate electrode 19 as load body 10, which is formed in such a way that it has in its center an opening, for example circular in shape, which is larger than substrate 12, and which is also formed by a projecting part 10' or "nose" so that it presses holding element 11 onto substrate electrode 19 by its weight. In this way, load body 10 applies a load to holding element 11 without covering substrate 12, so that the latter is accessible for example to plasma etching from above.

Base 17 according to FIG. 1 is grounded, while substrate electrode 19 is connected in a known manner to a high-voltage feed line 15, via which high-frequency power is able to be applied thereto. In addition, opposite the latter, substrate electrode 19 has insulated feed-throughs, for example ceramic feed-throughs, so that an electrical DC voltage may be applied, for example an electrical voltage of 1000 V to 2000 V, via clamping voltage feed lines 16 to holding element 11. Substrate electrode 19 is electrically insulated from this voltage, so that the latter is present only at holding element 11, and brings about a clamping or fixing of substrate 12 on holding element 11 via an electrostatic clamping or an electrostatic force induced by clamping voltage feed lines 16. At the same time, holding element 11 is also clamped against substrate electrode 19 by an identical electrostatic force emanating from its underside.

Finally, FIG. 1 provides for gaseous helium as a convection medium 30 to be able to be fed via a feed line 14 to the side of holding element 11 facing substrate electrode 19, the helium may also penetrate the area between holding element 11 and substrate 12 via channels 25 provided in holding element 11. Convection medium 30 is used to dissipate heat from the area between substrate electrode 19 and holding element 11 and from the area between holding element 11 and the back of substrate 12. Accordingly, holding plate 11 has a correspondingly structured holding surface 13 on its top and bottom, which may be in an available manner.

Figure 2:
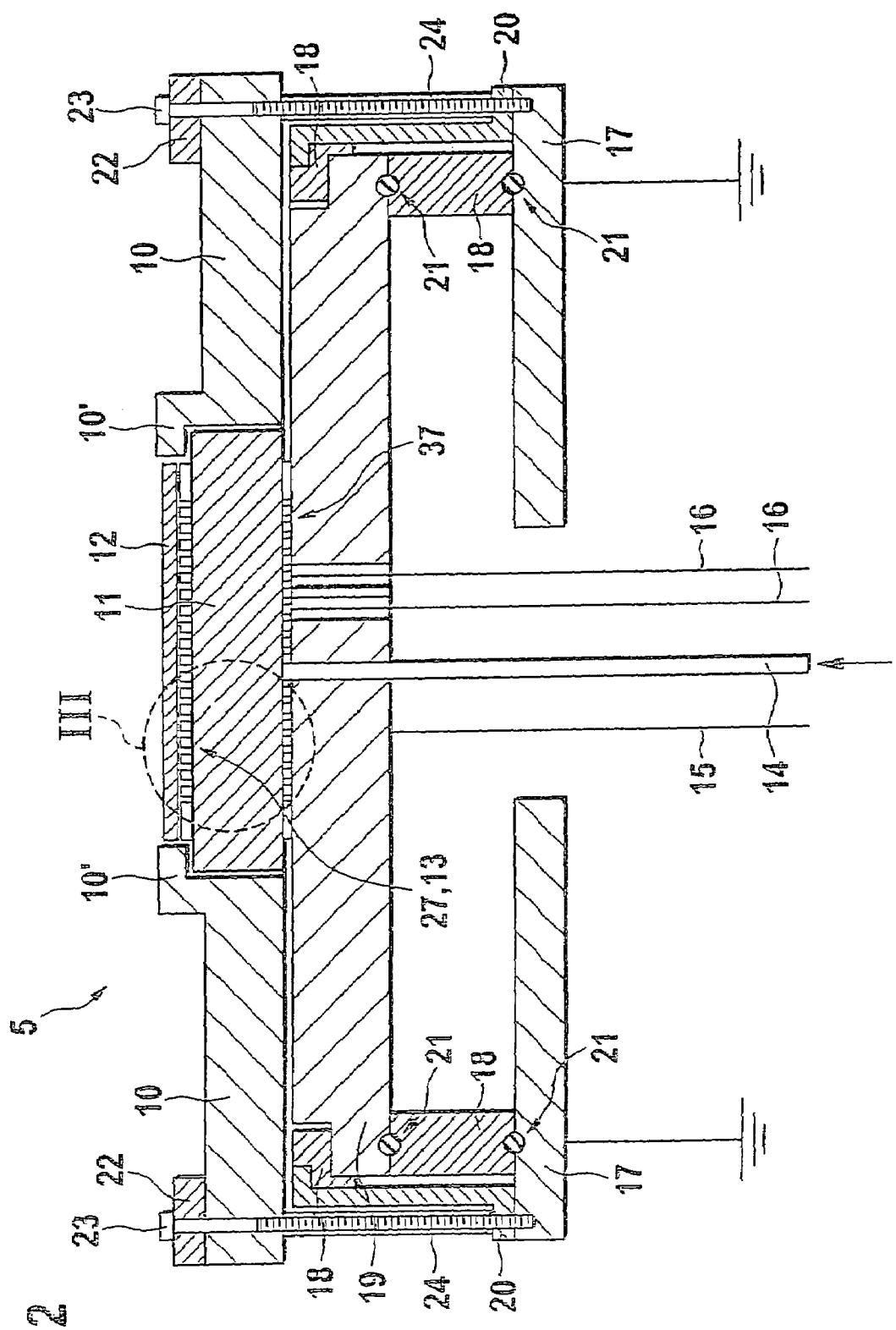
FIG. 2 shows a first exemplary embodiment of the present invention with an electrostatic holding device that has been modified from FIG. 1.

FIG. 2 shows a first exemplary embodiment of the present invention for a holding device 5, which is constructed similarly to the holding device according to FIG. 1, but in which primarily the thermal "floating" of the ceramic load body provided in FIG. 1 around substrate 12 has been eliminated. In detail, FIG. 2 provides that by using an aluminum ring or an anodized ring, or more generally a clamping device 22 which may be in the form of a clamping ring, load body 10 is firmly connected with grounded base 17 and is thus pressed against the surface of substrate electrode 19. Here clamping device 22 and the connection of clamping device 22 with base 17 via a fastening element 23 and a connecting element 24 are configured or arranged so that load body 10, which is made up anyway of an insulator such as ceramic or quartz glass, and base 17 are electrically insulated from substrate electrode 19. Fastening element 23 in the illustrated example is a screw, while connecting element 24 is for example a sleeve, a bar or likewise a screw. The use of a clamping ring as clamping device 22 advantageously exerts a very even clamping force on load body 10, so that the danger of shearing or splitting is ruled out.

All in all, holding device 5 according to FIG. 2 achieves improved thermal coupling of load body 10 to the temperature of substrate electrode 19, which results in a significant improvement in the properties of a high-rate plasma etching process, for example of the type described in DE 42 41 045 C1, particularly in the edge area of substrate 12. In addition, this also prevents or reduces unwanted process drift between a hot and a cold status of the system, which results primarily from heating of load body 10, which continues to be, for example, a ceramic plate, directly around substrate 12.

In another exemplary embodiment, a layer that evens out surface irregularities and/or ensures uniform optimal heat dissipation, which may be a silicone grease layer or a grease layer of a perfluorinated grease such as Krytox® grease or Fomblin® grease is also provided between load body 10 and the surface of substrate electrode 19.

In general it is important that the desired clamping takes place via grounded base 17 and not via substrate electrode 19 itself, to which high-frequency power is applied, since in that case the high frequency would act on clamping device 22, which would have negative effects on the plasma etching process and would also result in sputtering-off effects. In this respect, in the case of the exemplary embodiment of the invention according to FIG. 2, it is also advantageous for electrical reasons that clamping ring 22, which is grounded via base 17, runs around substrate 12 and is electrically conductive.

Figure 3:
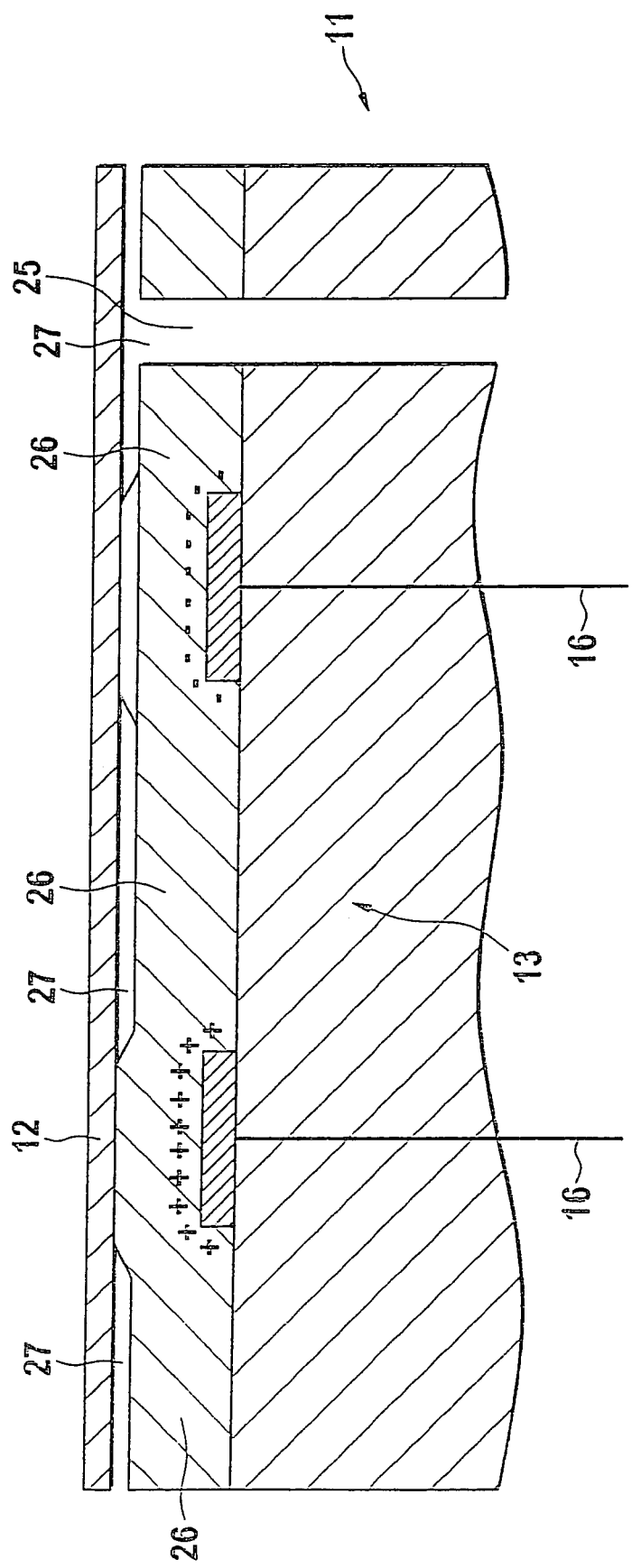
FIG. 3 shows a second exemplary embodiment of the present invention, only the area identified by hatching in FIG. 2 being shown.

FIG. 3 shows the section from FIG. 2 that is identified with hatching in FIG. 2, it being recognizable that holding element 11 according to FIG. 2 may have a plurality, for example 6 to 8, of channels 25 traversing it, which lead from the side of holding element 11 that faces substrate electrode 19 to the side of holding element 11 that faces substrate 12. A convection medium that is fed via feed line 14 is able to reach the area beneath substrate 12 through channels 25.

Furthermore, on its side facing substrate 12, holding element 11 has a holding surface 13, which is structured in a manner known per se and is initially formed in the exemplary embodiment according to FIG. 2 of a dielectric material such as $Al_2O_3$. Because of the structured holding surface 13, areas of the underside of substrate 12 are supported by a dielectric material, while cavities 27, which are bounded by substrate 12 and by recesses provided on the surface of holding element 11, form in other areas.

Cavities 27 are at least partially connected to channels 25, so that the convection medium, such as helium, may penetrate these cavities. It is recognizable in FIG. 3 that clamping voltage feed lines 16 reach into the vicinity of the surface of holding element 11, and that there is an electrical DC voltage there that causes an electrostatic fixation of substrate 12 on holding element 11. The structure of channels 25 and their arrangement or configuration and penetration through holding body 11 is implemented for example as in the electrostatic "chucks" known from the related art.

In a second exemplary embodiment, which will also be explained on the basis of FIG. 3, alternatively to the previous exemplary embodiment, the dielectric material $Al_2O_3$ provided on the side of holding element 11 that faces substrate 12 has been replaced by a ferroelectric material or, which may be, a piezoelectric material 26, such as a lead-zirconium-titanate ceramic (LZT ceramic), which is now used as the dielectric material instead of the $Al_2O_3$. The advantage in this context is that, in a piezoelectric material 26 or an alternatively usable ferroelectric material, permanent dipoles that are already present are aligned by the electrical field that is applied via clamping voltage feed line 16 or the DC electrical voltage that is applied through it, and this is thus polarized, so that the electrostatic clamping forces exerted on substrate 12 are significantly greater than in the case of a dielectric material such as $Al_2O_3$.

The polarization thus supports the outer electrical field applied via clamping voltage feed lines 16 and causes a reinforcement of the fixation of substrate 12 on holding element 11, so that a significantly higher holding force may be exerted on substrate 12 with the same electrical holding voltage.

In another exemplary embodiment according to FIG. 3, the increased electrostatic holding force also permits increasing of the pressure of the convection medium helium, and thus substantially improving the heat dissipation from the back of substrate 12 to substrate electrode 19. In particular, instead of the otherwise normal pressure of the supplied helium of 10 to 20 mbar, a pressure of 50 to 300 mbar, in particular of 100 to 200 mbar is used, which results in an improvement of heat dissipation by several orders of magnitude. The significant advantage of a piezoelectric material 26 or ferroelectric material on the side of holding element 11 that faces substrate 12 is thus first and foremost not the enhanced holding force per se, but above all the thus enabled higher pressure of convection medium 30 in the area of the cavities 27 between holding element 11 and substrate 12.

It should also be mentioned that through the use of piezoelectric or ferroelectric dielectric materials, the induced electrostatic holding forces do not disappear when the outer electrical field is switched off or the applied electrical voltages are switched off, since existing, initially aligned dipoles remain so at least to a large extent, even when there is no voltage or field present. It is therefore no longer sufficient in connection with this exemplary embodiment to simply turn off the outer field or the electrical voltage applied from outside, in order to release substrate 12 from holding element 11. Instead, when unloading or releasing substrate 12 from holding element 11, it is necessary to utilize a so-called "depolarization cycle," using an AC voltage, the amplitude of which is slowly reduced from a starting level to zero, for example. The alignment of the dipole moments then largely disappears, i.e., they subsequently lie in a chaotic distribution of directions.

This available method may be used for the demagnetization of materials and is necessary at this point in order to also be able to separate substrate 12 from holding element 11 again without significant force. It should also be emphasized at this point that as a result of the use of a piezoelectric material 26 as a dielectric material and the explained depolarization cycle, an advantageous vibrating motion (thickness vibration) is induced in piezoelectric material 26 via the piezoelectric effect, thereby resulting in further improved release of substrate 12 from holding element 11 and simplified overcoming of existing adhesion forces between adjacent surfaces. In particular, zones having positive or negative polarity, as sketched in FIG. 3, behave in opposite manners, i.e., they contract or expand, thereby greatly simplifying surface separation. In summary, so-called "declamping" is greatly simplified by the use of a piezoelectric material 26, which repeatedly results in the breaking of "glued-on" wafers when unloading, in the case of conventional electrostatic "chucks."

Figure 4:
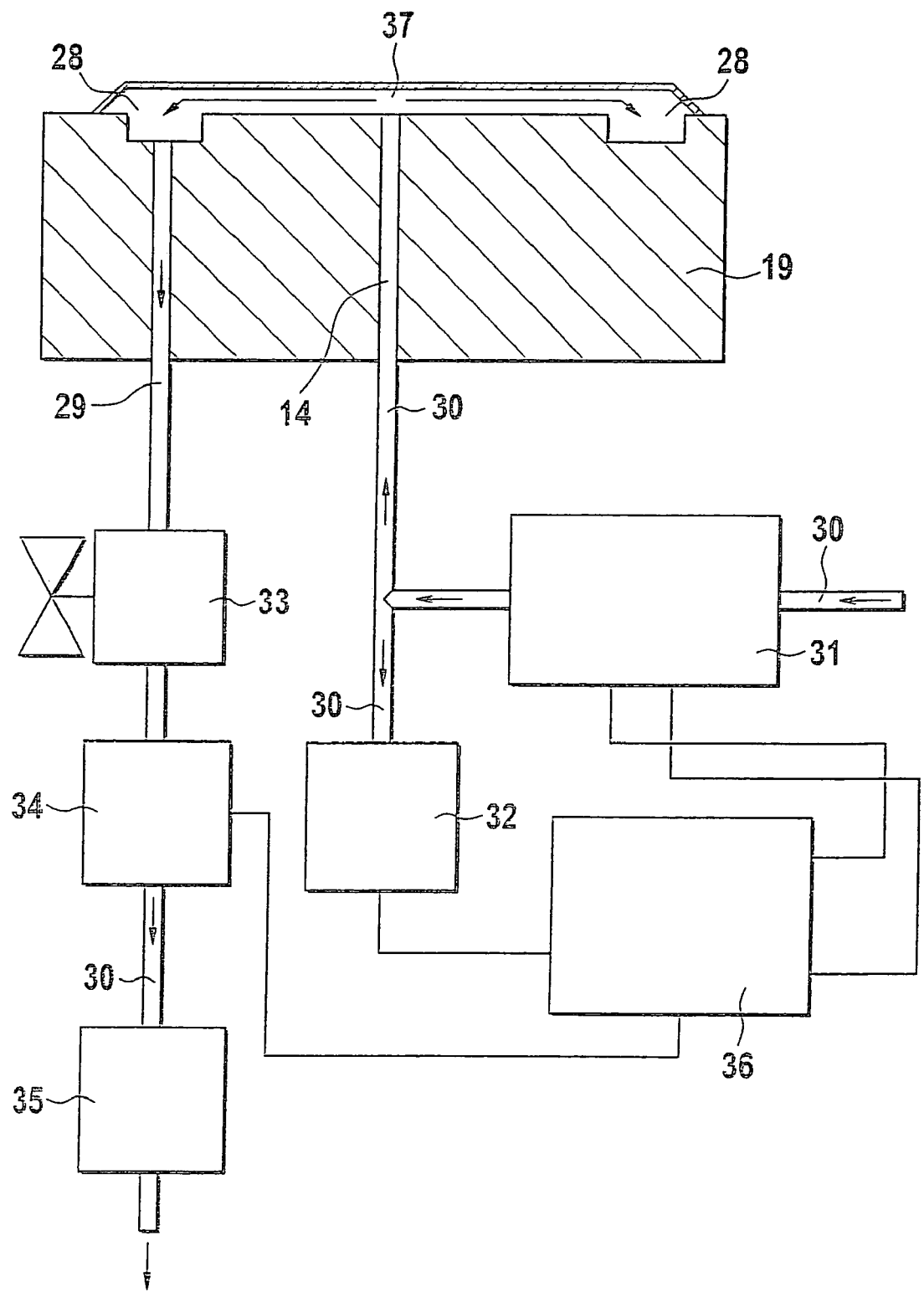
FIG. 4 shows a third exemplary embodiment of the present invention, the cooling of the back of a substrate held in the vacuum chamber via a liquid convection medium being displayed.

FIG. 4 illustrates an additional exemplary embodiment, instead of a gaseous convection medium 30, such as helium, a liquid is being used as convection medium 30, or more generally as a heat transport medium 30 between substrate 12 and holding element 11 and/or between holding element 11 and substrate electrode 19. This makes use of the fact that liquids conduct heat much better than gases and are even significantly superior to helium. However, a great many liquids cannot be used for cooling substrates in plasma etching systems, because they contaminate either substrate 12 or the system, or have a detrimental influence on the etching process being performed, even in very small quantities. The fluorocarbons are an exception, i.e., perfluorinated, long-chain alkanes or similar compounds, such as those sold for example by the 3M Corporation under the names FC77, FC84, or also as so-called "performance fluids" ("$PF_{xyz}$") Such fluorocarbons are of high purity, since practically no substances dissolve in them, they are absolutely inert and exhibit very high electrical puncture field strengths. In addition, the heat conductivity of fluorocarbons is excellent and their viscosity is low.

In addition, fluorine-based processes are generally used for high-rate etching in plasma etching systems, so that fluorocarbons do not interfere with the etching process being performed and have no detrimental effects on the etching process, even when they penetrate the etching chamber or vacuum chamber.

In that respect, the exemplary embodiment explained on the basis of FIG. 4 is particularly suitable for a plasma etching method according to the type of DE 42 41 045 C1, to perform a dissipation of heat or, if desired, also a supply of heat to or from the back of substrate 12, which is held in a vacuum chamber and is exposed for example to an input of heat from its front side.

In detail, the exemplary embodiment explained on the basis of FIG. 4 starts initially from a holding device 5 according to FIG. 2, FIG. 3 or also FIG. 1 known from the related art, a liquid convection medium 30, which may be a fluorocarbon, being used in place of the gaseous convection medium 30 helium.

In concrete terms, the fluorocarbon selected for the particular temperature range occurring in the individual case, for example the product FC77 from the 3M Corporation, is fed to substrate electrode 19 at the location at which helium is otherwise let in. To that end, FIG. 4 shows a substrate electrode 19 having a feed line 14 according to FIG. 1 or 2, through which the liquid convection medium is fed to the top side of substrate electrode 19. Since holding element 11 is on substrate electrode 19, a second space 37 is formed initially between the substrate electrode and holding element 11. In addition, the supplied liquid convection medium 30 penetrates holding element 11, for example via channels 25, and advances into the area of the cavities or recesses 27 between holding element 11 and substrate 12.

To supply the liquid convection medium, according to FIG. 4, there is first a conventional mass flow regulator 31, to which liquid convection medium 30 is fed, and which is connected with a control unit 36. Control unit 36 controls the inflow of liquid convection medium 30 through conventional regulation and a target value/actual value comparison. If there is a substrate 12 on substrate electrode 19 or on holding element 11, mass flow regulator 31 and another provided throttle valve 33, which is electrically controllable for example, are opened by control unit 36 wide enough that at a pressure sensor 32, for example a normal Baratron, a desired pressure of liquid convection medium 30 is measured or set at the back of substrate 12, i.e., the side of substrate 12 facing holding element 11. This hydrostatic pressure propagates itself under substrate 12. Since vacuum conditions prevail under substrate 12 before mass flow regulator 13 opens, liquid convection medium 30 thus instantly fills the entire space between substrate 12 and holding element 11 and between holding element 11 and substrate electrode 19.

Liquid convection medium 30 may be conducted to the center of substrate electrode 19 and/or the center of substrate 12, and from there may be collected again through a collecting channel 28 in the edge area of substrate 12 and led away via a removal line 29. As shown in FIG. 4, collecting channel 28 may be built into substrate electrode 19 in the area of the latter, and also into the side of holding element 11 that faces substrate 12. All in all, in this way liquid convection medium 30 supplied through feed line 14 is collected again via collecting channel 28 and suctioned off through a vacuum pump, not shown. Since, as explained, there are no compatibility problems between a high-rate etching method according to the type of DE 42 41 045 C1 and a fluorocarbon as liquid convection medium 30, a conventional bypass to a system pump stand or a turbomolecular pump that is already provided for the vacuum chamber may be used for this purpose.

Liquid convection medium 30 may drain away through electrically or manually adjustable throttle valve 33, through which a slight flow of for example 0.1 ccm/min to 1 ccm/min corresponding to the desired pressure is set one time in a fixed manner at the back of substrate 12. In that respect it is also sufficient to configure or arrange mass flow regulator 31 in the supply area for a very small maximum flow, which significantly reduces the problem of liquid overflows into the process chamber.

Liquid convection medium 30 flows from a supply reservoir, which may be at atmospheric pressure, through mass flow regulator 31 into the space between substrate 12 and substrate electrode 19, control unit 36 ensuring, by controlling mass flow regulator 31, that a desired hydrostatic pressure of for example 5 to 20 mbar always prevails there.

In addition, liquid convection medium 30 fills insofar as possible all the spaces between substrate 12 and substrate electrode 19, and is finally drawn off again via throttle valve 33, to which an optionally provided flow measuring device 34 is connected, via which the volume of convection medium 30 flowing away may be determined and conveyed to control unit 36.

In another exemplary embodiment, there is finally also a vaporizing device 35, for example an electric vaporizer, which is connected to throttle valve 33 or flow measuring device 34, and which vaporizes liquid convection medium 30 and supplies it in a gaseous state to the attached vacuum pump.

Control unit 36 is may also be used to detect malfunctions, i.e., in the event that substrate 12 is no longer adequately clamped on holding element 11, which may occur occasionally during a process, this condition is detected by control unit 36, which consequently halts further supply of the liquid convection medium. Since in such a case the heat contact between substrate electrode 19 and substrate 12 is lost anyway, the process being carried out must be stopped in any case, before it results in thermal overheating and hence to destruction of the silicon wafer used as substrate 12. While it is true that a fluorocarbon as a liquid convection medium 30, as described earlier, is in itself harmless for a plasma etching process according to German patent document no. 42 41 0451, and also does not harm the used vacuum system, the quantity of fluorocarbon that penetrates the etching chamber should nevertheless always be kept as minimal as possible.

This goal is achieved by having control unit 36 constantly compare the supplied volume of liquid convection medium 30 detected by mass flow regulator 31 with the volume of liquid convection medium 30 flowing away that is detected by flow measuring device 34. If a discrepancy that exceeds certain tolerances arises in this comparison, the additional supply of liquid convection medium 30 is halted by control unit 36, and the process is terminated with an error message. In addition, it is then provided that spaces 27, 37 between substrate 12 and substrate electrode 19 will be emptied quickly, so that during subsequent unloading of incorrectly clamped substrate 12, there is no longer any liquid convection medium 30 present there.

As an alternative to measuring the draining quantity of liquid convection medium 30, throttle valve 33 may be calibrated one time, and thus, given a fixed position of throttle valve 33, to determine the quantity of liquid convection medium 30 to be supplied through mass flow regulator 31 that is necessary in order to build up the desired hydrostatic pressure as a function of time. This value or this value table in the form of "pressure as a function of flow" is then used by control unit 36 in order to immediately detect a leak in the case of deviations, in particular overruns of this supply value, and to interrupt the process and the further supply of convection medium 30. In contrast to the use of gaseous helium as the convection medium, in which case there is always leakage in the electrode area since helium can never be completely sealed off by electrostatic clamping of substrate 12, leakage of liquid is extremely minimal given a correctly clamped substrate 12, so that throttle valve 33 may be set to very small values. In addition, control unit 36 no longer has to allow for a constant leak as a corresponding offset or safety reserve, as is the case with helium cooling of the back side.

Finally, the described safety device that causes shut down of the process has to be deactivated in the first seconds after substrate 12 is loaded, since liquid convection medium 30 first has to flow into existing spaces 27, 37 and fill them in this initial phase, before drainage via the collecting channel 28 may take place. Conversely, before unloading substrate 12, i.e., when the supply of convection medium 30 is turned off, only drainage is still detected, so that the vacuum pump evacuates the area beneath substrate 12 before it can finally be lifted dry from holding element 11 and unloaded.

The previously mentioned, increased electrical puncture strength of holding device 5 that arises from the use of a liquid convection medium also results from the fact that the puncturing of a dielectric material comes primarily from isolated, point-type defects such as so-called pinholes, voids, inclusions, cracks and grooves having locally reduced puncture strength that are present locally on the surface of the dielectric material, and as the weakest points in an otherwise intact surface of electrostatic holding element 11 determine the failure of the entire component. Therefore, although the greatest part of the surface of electrostatic holding element 11 would certainly tolerate higher electrical voltages or electrical fields, the actually applicable electrical voltage is limited by a few point-sized defects. Since in the exemplary embodiment explained on the basis of FIG. 4, the entire electrostatic holding element 11 is embedded during operation in liquid dielectric convection medium 30 having high electrical puncture strength and self-quenching properties, such point-sized defects are repaired. This effect also results in further significantly higher clamping forces and more reliable operation of entire holding device 5 against the risk of electrical discharges.

What is claimed is:

1. A holding device for fixing a semiconductor wafer in a plasma etching device, comprising:
    a holding arrangement that is positioned on a substrate electrode and on which a substrate of the semiconductor wafer is electrostatically fixable;
    a clamping arrangement; and
    a load body that is positioned on the substrate electrode and presses the holding arrangement onto the substrate electrode, the load body being connected with a base that supports the substrate electrode via the clamping arrangement, which presses the load body onto the substrate electrode, the load body and the base being electrically insulated from the substrate electrode;
    wherein the clamping arrangement includes a metallic clamping ring, which is electroconductively connected to the base via at least one of a metallic fastening element and a metallic connecting element; and
    wherein the base is grounded.

2. A holding device for fixing a semiconductor wafer in a plasma etching device, comprising:
    a holding arrangement that is positioned on a substrate electrode and on which a substrate of the semiconductor wafer is electrostatically fixable; and
    a device with which a liquid convection medium is feedable via at least one feed line into a first space, which is formed by the holding arrangement and the substrate positioned on the holding arrangement, at least in some areas between the holding arrangement and the substrate, and is drainable from there again via at least one drain lines;
    wherein the holding arrangement includes at least one channel or a liquid-pervious area, connected to a feed line for a convection medium, and via which the convection medium, at least one of a liquid, a fluorocarbon, or a perfluorinated, long-chain alkane, is feedable to a surface of the holding arrangement that faces the substrate; and
    wherein the at least one channel or the liquid-pervious area connects at least one first space located between the substrate and the holding arrangement with at least one second space located between the holding arrangement and the substrate electrode.

3. The holding device of claims 1 or 2, wherein the holding arrangement includes a holding plate and has, at least on its side facing the substrate, at least one of a dielectric material, $Al_2O_3$, a ferroelectric material, a piezoelectric material, lead-zirconate-titanate ceramic (LZT ceramic), in the form of a corresponding layer or coating, which insulates the holding arrangement electrically from the substrate.

4. The holding device of claim 1, further comprising:
    a holding arrangement that is positioned on a substrate electrode, and on which a substrate of the semiconductor wafer is electrostatically fixable, wherein at least a side of the holding arrangement facing the substrate has at least on a surface, an electrically insulating ferroelectric material or an electrically insulating piezoelectric material, via which an electrostatic force may be exerted by the holding arrangement on the substrate via an electrically induced polarization;
    electric components via which permanent dipoles, present in the ferroelectric material or the piezoelectric material, satisfy at least one of the following:
        the permanent dipoles are alignable at least temporarily so that a fixing or reinforcement of the fixing of the substrate positioned on the holding arrangement is induced at least for a duration of an aligned state, and
        the permanent dipoles are adjustable or modifiable in their orientation or transformable into a state which is at least nearly unaligned on statistical average, at least temporarily, so that at least during this period, a release of the substrate positioned on the holding arrangement from the holding arrangement is induced or facilitated.

5. The holding device of claim 2, further comprising:
    a load body that is positioned on the substrate electrode and that presses the holding arrangement onto the substrate electrode.

6. The holding device of claim 5, wherein the load body is connected via a clamping device to a base which supports the substrate electrode, the clamping device pressing the load body onto the substrate electrode, and the load body and the base being electrically insulated from the substrate electrode.

7. The holding device of claim 1, wherein the load body includes a ceramic, which is an essentially ring-shaped plate or cover having an opening, the opening being dimensioned and positioned so that a surface of the substrate facing away from the holding arrangement is accessible.

8. The holding device of claims 1 or 2, further comprising:
    an arrangement to allow a high-frequency voltage to be applied to the substrate electrode.

9. The holding device of claims 1 or 2, wherein the holding arrangement includes at least one channel, a gas-pervious area or a liquid-pervious area, connected to a feed line for a convection medium, and via which the convection medium, at least one of a liquid, a fluorocarbon, a perfluorinated, long-chain alkane, a gas, or helium, is feedable to a surface of the holding arrangement that faces the substrate.

10. The holding device of claims 1 or 2,
    wherein the holding arrangement includes at least one channel, a gas-pervious area or a liquid-pervious area, connected to a feed line for a convection medium, and via which the convection medium, at least one of a liquid, a fluorocarbon, a perfluorinated, long-chain alkane, a gas, or helium, is feedable to a surface of the holding arrangement that faces the substrate; and wherein the surface of the holding arrangement that faces the substrate includes a structuring that defines at least one recess, the at least one recess being connected to at least one of the at least one channel, the gas-pervious area or the liquid-pervious area, and may thereby be exposed to the convection medium.

11. The holding device of claims 1 or 2, wherein the substrate electrode is electrically insulated from the base, which is plate-shaped, via an insulator that includes at least one ceramic ring.

12. The holding device of claims 1 or 2, further comprising:
  parts via which a clamping voltage can be applied between at least one of (i) the substrate and the holding arrangement; and (ii) the holding arrangement and the substrate electrode, thereby causing an electrostatic fixing of the substrate to the holding arrangement.

13. The holding device of claim 1, wherein the clamping arrangement includes an aluminum clamping ring which is surface-anodized.

14. The holding device of claim 1, wherein at least one of the following is satisfied: (i) the load body is in contact in some areas with the substrate electrode, and (ii) a layer is provided between the load body and the substrate electrode, so as to at least one of even out surface irregularities and ensure uniform, optimal heat dissipation, the layer including a silicone grease layer or a perfluorinated grease layer.

15. The holding device of claim 1, further comprising:
  a device via which a liquid or gaseous convection medium is feedable via at least one feed line into a first space, which is formed by the holding arrangement and the substrate positioned on it, at least in some areas between the two, and can be drained away from there again via at least one drain line.

16. The holding device of claim 15, wherein the device includes:
  at least one of an adjustable throttle valve and a flow device;
  a pressure sensor;
  an electronic control unit; and
  a vaporizing device.

17. The holding device of claims 1 or 2,
  wherein the holding arrangement includes at least one channel, a gas-pervious area or a liquid-pervious area, connected to a feed line for a convection medium, and via which the convection medium, at least one of a liquid, a fluorocarbon, a perfluorinated, long-chain alkane, a gas, or helium, is feedable to a surface of the holding arrangement that faces the substrate; and
  wherein the substrate electrode includes at least one feed line traversing it at its center or in a vicinity of its center, via which the convection medium is feedable to a second space between the holding arrangement and the substrate electrode and connected to at least part of the at least one channel, the gas-pervious area or the liquid-pervious area, and the substrate electrode includes at least one drain line traversing it, as far as possible from the center of the substrate, via which the convection medium is drainable from the second space.

18. The holding device of claims 1 or 2,
  wherein the holding arrangement includes at least one channel, a gas-pervious area or a liquid-pervious area, connected to a feed line for a convection medium, and via which the convection medium, at least one of a liquid, a fluorocarbon, a perfluorinated, long-chain alkane, a gas, or helium, is feedable to a surface of the holding arrangement that faces the substrate;
  wherein the substrate electrode includes at least one feed line traversing it at its center or in a vicinity of its center, via which the convection medium is feedable to a second space between the holding arrangement and the substrate electrode and connected to at least part of the at least one channel, the gas-pervious area or the liquid-pervious area, and the substrate electrode includes at least one drain line traversing it, as far as possible from the center of the substrate, via which the convection medium is drainable from the second space; and
  wherein a drain line in an area of the surface of the substrate electrode facing the holding arrangement is connected with a collecting channel for the convection medium that is integrated into the substrate electrode, and the collecting channel is connected with at least one of (i) at least part of the at least one channel, the gas-pervious area or the liquid-pervious area, and (ii) the second space.

19. The holding device of claim 1,
  wherein the holding arrangement includes at least one channel, a gas-pervious area or a liquid-pervious area, connected to a feed line for a convection medium, and via which the convection medium, at least one of a liquid, a fluorocarbon, a perfluorinated, long-chain alkane, a gas, or helium, is feedable to a surface of the holding arrangement that faces the substrate; and
  wherein the at least one channel, the gas-pervious area or the liquid-pervious area connects at least one first space located between the substrate and the holding arrangement with at least one second space located between the holding arrangement and the substrate electrode.

20. A method for supplying heat to or dissipating heat from the back of a substrate held in a vacuum chamber, the heat being input into the front side of the substrate by plasma etching, the method comprising:
  holding the substrate in the vacuum chamber by a holding device; and
  applying a liquid convection medium, including a fluorocarbon, to the back of the substrate;
  wherein the holding device is for fixing a semiconductor wafer in a plasma etching device, and includes:
    a holding arrangement that is positioned on a substrate electrode and on which the substrate of the semiconductor wafer is electrostatically fixable,
    a clamping arrangement, and
    a load body that is positioned on the substrate electrode and presses the holding arrangement onto the substrate electrode, the load body being connected with a base that supports the substrate electrode via the clamping arrangement, which presses the load body onto the substrate electrode, the load body and the base being electrically insulated from the substrate electrode.

21. The holding device of claim 2, wherein the clamping arrangement is grounded.

* * * * *